US011592467B2

(12) United States Patent
Veil et al.

(10) Patent No.: US 11,592,467 B2
(45) Date of Patent: Feb. 28, 2023

(54) INPUT CIRCUIT FOR THE FAIL-SAFE READING IN OF AN ANALOG INPUT SIGNAL

(71) Applicant: Pilz GmbH & Co. KG, Ostfildern (DE)

(72) Inventors: Richard Veil, Ostfildern (DE); Bernd Harrer, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 1033 days.

(21) Appl. No.: 16/189,834

(22) Filed: Nov. 13, 2018

(65) Prior Publication Data

US 2019/0146012 A1 May 16, 2019

(30) Foreign Application Priority Data

Nov. 14, 2017 (DE) .......................... 102017126754.9

(51) Int. Cl.
*G01R 19/00* (2006.01)
*G05B 9/03* (2006.01)
(Continued)

(52) U.S. Cl.
CPC ........... *G01R 19/0092* (2013.01); *G05B 9/03* (2013.01); *G05B 19/0425* (2013.01);
(Continued)

(58) Field of Classification Search
None
See application file for complete search history.

(56) References Cited

U.S. PATENT DOCUMENTS

| 2005/0024019 A1* | 2/2005 | Matsumoto | ....... H02J 7/007188 |
| | | | 320/132 |
| 2014/0077741 A1* | 3/2014 | Kumagai | ............... B62D 5/049 |
| | | | 318/490 |
| 2017/0089955 A1* | 3/2017 | Yugou | ................... B60L 3/0038 |

FOREIGN PATENT DOCUMENTS

| DE | 19722872 A1 | 12/1998 |
| JP | 05122836 A | 5/1993 |
| WO | 200915593 A1 | 12/2009 |

OTHER PUBLICATIONS

Tim Regan, Jon Munson, Greg Zimmer, Michael Stokowski (Linear Technology, Application Note 105, Dec. 2005) (Year: 2005).*

(Continued)

*Primary Examiner* — Lee E Rodak
*Assistant Examiner* — Joseph O Nyamogo
(74) *Attorney, Agent, or Firm* — Edell, Shapiro & Finnan, LLC

(57) ABSTRACT

An input circuit for reading in an analog input signal of a sensor comprises: first and second input ports connectable to the sensor; a first current-measuring signal converter connected to the first input port and comprising a current-measuring apparatus to determine a first output signal from the analog input signal; a current-limiting apparatus inside the first current-measuring signal converter for limiting a maximum current flowing through the first current-measuring signal converter; and a second current-measuring signal converter connected to the second input port and comprising a current-measuring apparatus to determine a second output signal from the analog input signal, wherein the first and second current-measuring signal converters are connected in series; and a testing apparatus for comparing the first and second output signals to detect faults of the first and second current-measuring signal converters in response to devia- (Continued)

tions between the first and second output signals exceeding a limit value.

15 Claims, 2 Drawing Sheets

(51) Int. Cl.
    *G05B 19/042*     (2006.01)
    *G06F 11/07*     (2006.01)
    *H01H 47/00*     (2006.01)
    *H03K 17/08*     (2006.01)

(52) U.S. Cl.
    CPC ....... *G06F 11/0796* (2013.01); *H01H 47/002* (2013.01); *H03K 17/08* (2013.01); *G05B 2219/21154* (2013.01); *G05B 2219/24182* (2013.01)

(56) References Cited

OTHER PUBLICATIONS

Linden T. Harrison (Current Sources & Voltage References, 2005) (Year: 2005).*
Regan, T., et al., "Application Note 105: Current Sense Circuit Collection, Current Sense Basics", Analog Circuit Design, Linear Technology, Edited by Bob Dobkin and John Hamburger ,Dec. 2005.
Search Report in corresponding European Patent Application No. 18202320.0, completed Mar. 13, 2019, with English translation.
Office Action in corresponding Japanese Patent Application No. 2018-214205, dated Jun. 28, 2022, with English translation.

* cited by examiner

INPUT CIRCUIT FOR THE FAIL-SAFE READING IN OF AN ANALOG INPUT SIGNAL

CROSS REFERENCE TO RELATED APPLICATIONS

This application claims foreign priority under 35 U.S.C. § 119(a)-(d) to Application No. DE 102017126754.9, filed on Nov. 14, 2017, the entire contents of which are hereby incorporated by reference.

TECHNICAL FIELD

The present invention relates to an input circuit for the fail-safe reading in of an analog input signal of at least one sensor, the input circuit comprising a first input port and a second input port, to which the sensor can be connected, as well as a first current-measuring signal converter, which is connected to the first input port and comprises a current-measuring apparatus, which is configured to determine a first output signal from the analog input signal when the input circuit is in operation. In addition, the invention relates to a safety switching apparatus for the safe shutdown of a load device in an automatically operating technical system, the safety switching apparatus comprising an input circuit, which is configured for the fail-safe reading in of an analog input signal of an analog sensor and for converting the analog input signal into at least one analog output signal; an analog-digital converter that is designed to convert the at least one output signal of the input circuit into at least one digital signal; a control and evaluation unit that is designed to receive and to process the digital signal of at least one analog-digital converter; as well as at least one actuator that is connected to the control and evaluation unit and to the load device and can be controlled as a function of the digital signal.

BACKGROUND

Automatically operating technical systems have become increasingly significant and widespread for many years. Some examples that can be mentioned in this context include automatically operating systems in industrial production processes, automatically operating systems for transporting people and goods, or systems that are used in the building automation technology. In such technical systems, the safety aspects for avoiding personal injury and damage to property are becoming increasingly more important since an automatically operating technical system can result in a number of risks that can be caused, in particular, by an operating error or by an error in the workflow of the system.

Typical measures for securing automatically operating technical systems include, for example, establishing protection zones using light barriers, light grids and protective fences, etc., as well as providing emergency OFF switches, that enable a safe shutdown of the system (or a part of the system). A central component of an automatically operating technical system is a safety switching apparatus that is in a communication link with sensors and actuators (actuators) via, for example, a field bus. A safety switching apparatus can comprise, in particular, an evaluation and control unit that can be designed as a safety programmable logic controller. In addition to digital inputs for receiving digital input signals, a safety switching apparatus can also comprise analog inputs, by which the safety switching apparatus can be fed analog measuring signals of a sensor. At this point analog pressure sensors, temperature sensors, speed sensors or flow sensors that can provide the safety switching apparatus with analog measuring signals, in particular, analog current signals, should be mentioned merely for illustrative purposes. One example of a sensor, which can be connected directly to an analog input of a safety switching apparatus, is a so-called 2-wire sensor, wherein the energy supply and the measuring signal are routed over a common line. In addition, 3-wire sensors and 4-wire sensors are also used.

The actual measured values, acquired by the sensor in operation, are normalized to a level by the sensor in a suitable manner, so that the sensor emits a normalized analog measuring signal, which is made up of the kind of signal (for example, an electric current or an electric voltage) and the amount (for example, in accordance with the standard EN 61131-2:2007, an amount ranging from 0 mA to 20 mA in the case of a current signal or 0 V to 10 V in the case of a voltage signal) that forms an analog input signal for an input circuit of the safety switching apparatus.

Preferably current interfaces with an outgoing and return line and low impedance inputs are used, in order to transmit analog sensor signals to a safety switching apparatus. The current interfaces are characterized, in particular, by the feature that they are insensitive to noise even in the case of relatively long lines. It has been found that the 0 mA to 20 mA type of signal does not lend itself or, more specifically, lends itself only to a limited extent to the aforementioned 2-wire sensors, since at a current of 0 mA (i.e., at the start of the measurement range) no current flows and, as a result, the sensor needs an external current supply, so that it can be operated. Therefore, in the case of sensors, which deliver an analog current signal as the measuring signal, a useable signal range between 4 mA and 20 mA is often used. Therefore, at a zero signal of the sensor, there is still a current of 4 mA, so that the sensor can be supplied with energy over the entire signal range (i.e., also at the start of the measurement range). The input circuit for the fail-safe reading in of an analog input signal is typically configured to measure currents in a range between 0 mA and 25 mA. If input signals are sensed that are outside the actual working range between 4 mA and 20 mA, then the signal inputs are rated as faults. If, for example, a line break occurs in the outgoing or return line, then the transmission of the signal to the safety switching apparatus is interrupted. The input circuit measures a current of 0 mA that is outside the working range, so that this fault can be detected.

In accordance with the standard EN 61131-2:2007, the input resistance of the input circuit has to be ≤300 ohms. If a voltage of 24 V is applied to this input resistance, then an electric power of 1.92 W is converted at the input resistance. On the other hand, at a voltage of 30 V, the electric power, converted at the input resistance, is at 3 W. A type of resistor that is often used in analog circuits is the so-called mini MELF resistor that is designed in the SMD type of construction. Typically such mini MELF resistors are about 3.6 mm long and have a diameter of about 1.4 mm. They exhibit a typical power loss of 0.25 W. In order to design the input resistance of the input circuit in compliance with the aforementioned standard for 300 ohms at an input voltage in the amount of 30 V, twelve such mini MELF resistors have to be used. A single, suitably sized resistor (shunt resistor), which can be used to measure the current, would also be possible. Owing to the relatively large space requirement, the shunt resistor, at which it is possible to measure the voltage drop, in order to determine the electric current flowing through the input circuit, is usually not designed for an overvoltage of 30 V.

For example, the applicant of the present invention offers analog input modules under the name "PSSu". The analog input modules have an input circuit that exhibits an input resistance (shunt resistor) of 115 ohms and that is designed for a maximum continuous current of 40 mA. The maximum input current is already achieved at an input voltage of 4.6 V. If a higher input voltage is applied, then the shunt resistor can be destroyed under some circumstances, so that the input module is no longer functional and, therefore, has to be replaced.

SUMMARY

It is an object of the present invention to provide an input circuit for the fail-safe reading in of an analog input signal of at least one sensor, as well as a safety switching apparatus of the type described in the introduction of the description, such that with both the input circuit and the safety switching apparatus the protection of the input circuit against damages that can be caused, in particular, by the occurrence of overvoltages is improved.

The input circuit of the present invention is characterized by the feature that the input circuit comprises: a current-limiting apparatus, which is formed inside the first current-measuring signal converter and is configured to limit a maximum current, which in operation flows through the first current-measuring signal converter, at least one second current-measuring signal converter, which is connected to the second input port and comprises a current-measuring apparatus, which is configured to determine a second output signal from the analog input signal when the input circuit is in operation, wherein the first current-measuring signal converter and the second current-measuring signal converter are electrically connected in series, as well as a testing apparatus, which is connected to the two current-measuring signal converters and which is configured to compare the first output signal with the second output signal, in order to detect faults of the current-measuring signal converters, when deviations between the output signals exceed a predetermined or predeterminable limit value.

The invention provides a robust, fail-safe analog input circuit, which can receive and process analog current signals of a sensor. Owing to the current-limiting apparatus, which is integrated into the first current-measuring signal converter, the current, flowing through the input circuit, can be effectively limited, in particular, in the event of an overvoltage, so that, for example, damages to the components of the current-measuring signal converters of the input circuit can be effectively prevented. With the aid of the testing apparatus, which is connected to the two current-measuring signal converters, it is possible to compare the first output signal of the first current-measuring signal converter with the second output signal, which is made available to the second current-measuring signal converter. As a result, it is possible to achieve in an advantageous way, in particular, from the viewpoint of fail safety that potential faults of the current-measuring signal converters will be detected, when the deviations between the output signals, emitted by the current-measuring signal converters, exceed a predetermined or predeterminable limit value. The testing apparatus may be a separate (in particular, analog) module or component, in particular, a comparator that is connected to the two current-measuring signal converters. As an alternative, it can also be provided that the testing apparatus is a part of an evaluation and control unit of a safety switching apparatus that comprises the input circuit presented herein.

In a preferred embodiment, it is proposed that each of the current-measuring apparatuses comprises a shunt resistor, in particular, an operational amplifier, which is connected in parallel to each of the current-measuring apparatuses, for measuring and amplifying a voltage that drops off across the shunt resistor. The operational amplifiers may be designed, for example, as instrument amplifiers. Thus, the current-measuring apparatuses form current-voltage converters, where the intensity of the current is determined indirectly by measuring the voltage that drops off across the shunt resistors. Such current-measuring apparatuses are characterized by a high measurement accuracy as well as a robust type of construction. Due to the fact that both current-measuring signal converters comprise a current-measuring apparatus, the result is a redundancy that is particularly advantageous from the aspect of the fail safety.

In a particularly preferred embodiment, it can be provided that the current-limiting apparatus forms an in-phase regulator that comprises a bipolar transistor as well as a Zener diode with a series resistor. Using the Zener diode switched in reverse direction, an effective voltage limitation can be achieved, so that overvoltages inside the input circuit that can lead under some circumstances to damages, in particular, to damages to the shunt resistors, can be effectively prevented. The bipolar transistor can be designed, in particular, as an NPN transistor or as a PNP transistor. Preferably the bipolar transistor can be connected as an emitter follower.

In one advantageous embodiment, there is the possibility that the bipolar transistor comprises an emitter and a collector, between which a resistor is provided to absorb a power loss in the event that an overvoltage is applied to the input circuit. In the case of an overvoltage, which is defined by a breakdown voltage of the Zener diode, a portion of the input current can flow through the resistor between the emitter and the collector. As a result, one portion of the electric power loss can be absorbed by this resistor, so that in the event of an overvoltage the risk of damage to the bipolar transistor can be reduced. This embodiment is advantageous if the bipolar transistor is designed as an NPN transistor or as a PNP transistor.

In one preferred embodiment, it is proposed that, between the first input port of the input circuit and the emitter of the bipolar transistor, a resistor be provided in order to specify a limit current.

In an advantageous further development, there is the possibility that the input circuit comprises a testing apparatus that is designed such that it can test the function of the current-limiting apparatus. Thus, any faults of the current-limiting apparatus can be detected so that, from these faults, the resulting functional limitations of the input circuit can be detected.

The testing apparatus can be designed in a totally different way.

In a first design variant, the testing apparatus can be designed to measure an electric voltage that drops off between the first input port and the second input port of the input circuit.

In a second design variant, the testing apparatus can be designed to measure an electric voltage that drops off across the current-limiting apparatus.

In an additional design variant, the testing apparatus can be designed to measure an electric voltage that drops off across the current-limiting apparatus and the current-measuring apparatus of the first current-measuring signal converter.

The testing apparatus can comprise an amplifier, which is designed preferably as an operational amplifier, in particular, an instrument amplifier, which measures the corresponding drop in voltage and can emit an amplified voltage signal as an output signal. This output signal can be digitized, for example, by an analog-digital converter and, can be fed, in particular, to an evaluation and control unit of a safety switching device that comprises the input circuit. The evaluation and control unit can evaluate the output signal, in particular, compare with a specified value, in order to detect possible faults of the current-limiting apparatus. The testing apparatus can also comprise an analog comparator, by which such a comparison can be performed.

BRIEF DESCRIPTION OF THE DRAWINGS

Other features and advantages of the present invention will become apparent from the following description of preferred exemplary embodiments with reference to the accompanying drawings, in which.

DETAILED DESCRIPTION

Figure 1:
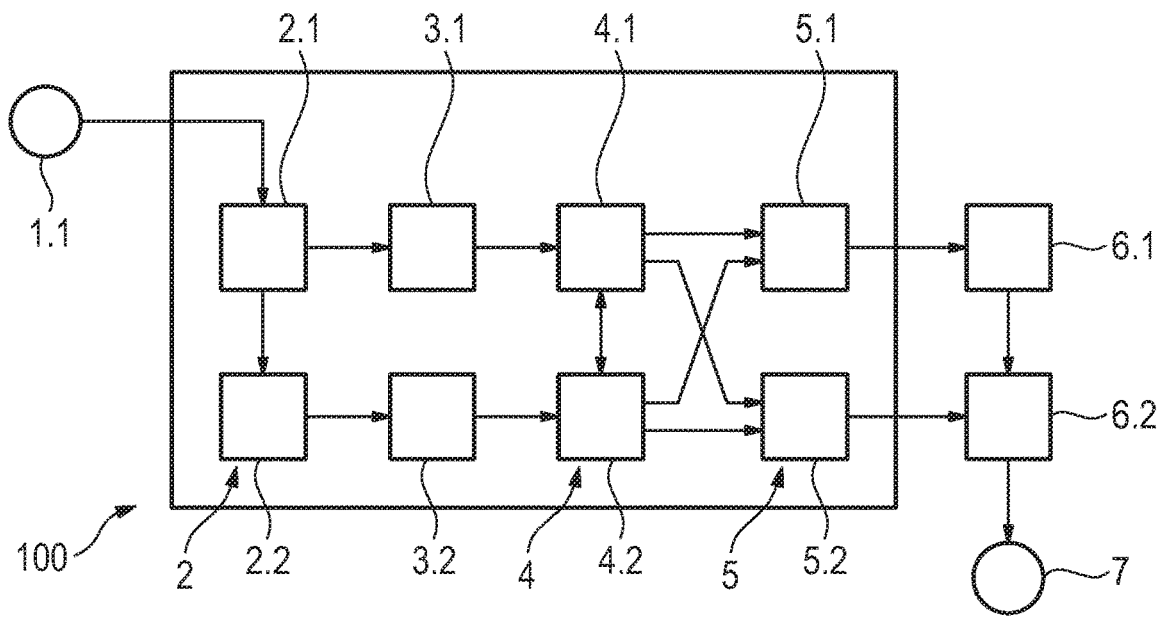
FIG. 1 is a block circuit diagram that shows the details of a signal sequence of a safety switching apparatus that is connected to a sensor as well as to two actuators for controlling a load device in an automatically operating technical system.

To begin with, with reference to FIG. 1, details of the basic structure of a safety switching apparatus 100 for an automatically operating technical system shall be explained in greater detail below. The safety switching apparatus 100 is connected to a sensor 1.1 and comprises an input circuit 2 that is designed to receive an analog input signal from the sensor 1.1 and to convert therein the analog input signal into a measuring signal that can be further processed. For this purpose the input circuit 2 comprises a first current-measuring signal converter 2.1 and a second current-measuring signal converter 2.2. The details of this input circuit 2 with the two current-measuring signal converters 2.1, 2.2 shall be explained in more detail below with reference to FIGS. 2 and 3. For reasons of redundancy, a two channel, partially crossing signal routing, is implemented in the safety switching apparatus 100, where in this case the individual signal paths are symbolized by corresponding arrows in FIG. 1.

The first current-measuring signal converter 2.1 is connected to a first A/D converter (analog to digital converter) 3.1 that converts a first analog output signal, made available by the first current-measuring signal converter 2.1, into a digital signal. The second current-measuring signal converter 2.2 is connected to a second A/D converter (analog to digital converter) 3.2 that converts a second analog output signal, made available by the second current-measuring signal converter 2.2, into a digital signal. The two A/D converters 3.1, 3.2 are connected to an evaluation and control unit 4 that is configured to process and to evaluate the digital signals, generated by the two A/D converters 3.1, 3.2.

In this embodiment, the evaluation and control unit 4 is constructed with two channels in a redundant design, a feature that has been shown in a highly simplified form by two microcontrollers 4.1, 4.2 in FIG. 1. The evaluation and control unit 4 can be, for example, the CPU of a safety programmable logic controller, such as those marketed by the applicant of the present invention under the name PSS®. As an alternative, the evaluation and control unit 4 can also be a part of a safety switching device, such as those offered by the applicant of the present invention in various designs under the name PNOZ®; or the evaluation and control unit may be a head module for a modular design of the safety switching apparatus 100. The two microcontrollers 4.1, 4.2 can monitor, in particular, each other for any malfunctions and/or can exchange data between each other.

Furthermore, the safety switching apparatus 100 comprises an output 5 with two redundant output stages 5.1, 5.2, where in this case each of the two microcontrollers 4.1, 4.2 is connected to each of the two output stages 5.1, 5.2, in order to be able to control them as a function of the digital signals, which are processed and evaluated by the evaluation and control unit 4. In this way a redundancy is also provided that is advantageous from safety-related aspects, in particular, from the aspect of fail safety.

The output stages 5.1, 5.2 of the safety switching apparatus 100 are connected in each case to an actuator 6.1, 6.2. In this case, a first output stage 5.1 of the output 5 is connected to a first actuator 6.1 (a first actuator). On the other hand, a second output stage 5.2 of the output 5 is connected to a second actuator 6.2 (a second actuator). The two actuators 6.1, 6.2 are electrically connected in series and are connected to a load device 7 in the automatically operating technical system. Both actuators 6.1, 6.2 are connected to the load device 7 such that they can be switched off, if needed, in a fail safe manner.

Figure 2:
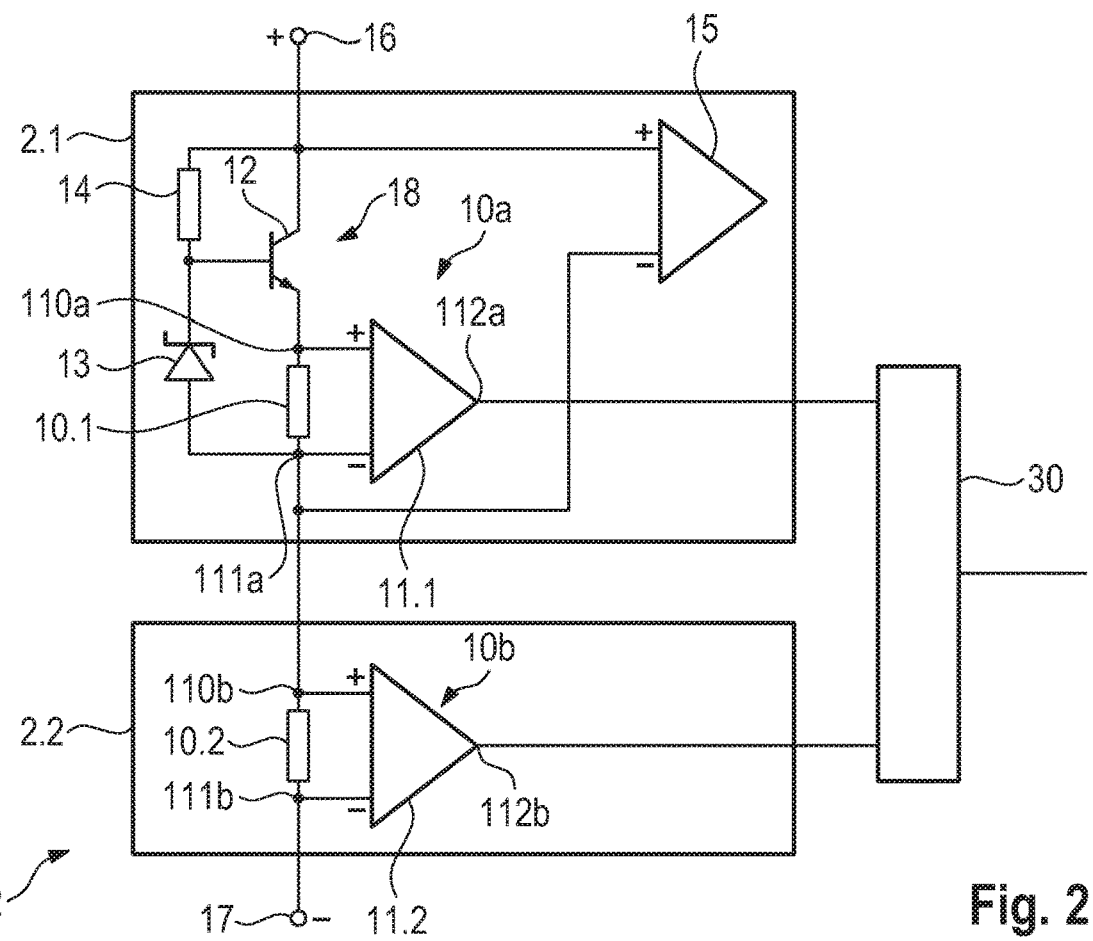
FIG. 2 is an input circuit for the safety switching apparatus in FIG. 1, the input circuit being designed in accordance with a first exemplary embodiment of the invention.

With reference to FIG. 2, a first exemplary embodiment of the input circuit 2 of the safety switching apparatus 100 shall be explained in detail below. As already stated above, the input circuit 2 comprises the two current-measuring signal converters 2.1, 2.2, which are electrically connected in series and can receive an analog input signal from the sensor 1.1. For this purpose, the input circuit 2 comprises a differential input that is formed by a first input port 16 (+) and a second input port 17 (−). The sensor 1.1 can be designed as a so-called 2-wire sensor, in which the energy supply, as well as the analog measuring signal, are supplied over a common line. The analog measuring signal is made available to the input circuit 2 by way of the two input ports 16, 17 as the input signal, which in the present embodiment is a current signal. The sensor 1.1 may be, in particular, a pressure sensor, a temperature sensor, a speed sensor or a flow sensor.

Preferably the analog sensor 1.1 is configured such that it can deliver an analog current signal, the useable signal range of which is between 4 mA and 20 mA. Thus, the differential input, formed by the two input ports 16, 17, can be designed, in particular, as a standardized 4 mA to 20 mA input interface. Thus, in the case of a null signal of the sensor 1.1, a current of 4 mA still continues to flow so that the sensor 1.1 can be supplied with energy over the entire signal range and, thus, also at the start of the measurement range. The input circuit 2 can be configured preferably to measure currents in a range between 0 mA and 25 mA. If input signals are detected that are outside the actual working range between 4 mA and 20 mA, then the input signals are rated as faults.

The first current-measuring signal converter 2.1 comprises a current-measuring apparatus 10a that in the present exemplary embodiment is formed by a shunt resistor 10.1, which is used to measure indirectly the intensity of the electric current, and by an operational amplifier 11.1, in particular, by an instrument amplifier, with both the shunt resistor and the operational amplifier being connected in parallel to one another. The current-measuring apparatus 10a of the first current-measuring signal converter 2.1 comprises a first input 110a, a second input 111a and an output 112a, which is provided for emitting a first (analog) output signal, where in this case the first input 110a is connected to the first input port 16 of the input circuit 2 by way of a current-limiting apparatus 18.

The second current-measuring signal converter 2.2 comprises a current-measuring apparatus 10b that, in the present exemplary embodiment, is formed by a shunt resistor 10.2, which is used to measure indirectly the intensity of the electric current, and by an operational amplifier 11.2, with both the shunt resistor and the operational amplifier also being connected in parallel to one another. The current-measuring apparatus 10b of the second current-measuring signal converter 2.2 comprises a first input 110b, a second input 111b and an output 112b, which is provided for emitting a second (analog) output signal, where in this case the second input 111b is connected to the second input port 17 of the input circuit 2.

Since the two current-measuring signal converters 2.1, 2.2 are electrically connected in series, the second input 111a of the first current-measuring apparatus 10a is connected to the first input 110b of the second current-measuring apparatus 10b. The shunt resistors 10.1, 10.2 are designed with low impedance and can have, for example, an (identical) resistance value of 50 ohms.

The two current-measuring apparatuses 10a, 10b form two current-voltage converters from a functional view. If an electric current flows through the two shunt resistors 10.1, 10.2, then the current causes the voltage to drop off between the respective inputs 110a, 111a and 110b, 111b, respectively, of the current-measuring apparatuses 10a, 10b. In this case the voltage drop is, according to Ohm's law, proportional to the intensity of the current. The operational amplifiers 11.1, 11.2 serve the purpose of amplifying the measured voltage signal, so that this amplified signal can be emitted as the output signal. As a result of the electrical series connection of the current-measuring signal converters 2.1, 2.2, the current, which flows through the current-measuring apparatuses 10a, 10b in the normal operating mode, is identical. Thus, when the shunt resistors 10.1, 10.2 exhibit the same size, the drop in voltage that is measured at the shunt resistor 10.1 by the current-measuring apparatus 10a of the first current-measuring signal converter 2.1 corresponds to the drop in voltage at the shunt resistor 10.2 of the current-measuring apparatus 10b of the second current-measuring signal converter 2.2.

In addition, the input circuit 2 comprises a testing apparatus 30 for testing the function of the current-measuring apparatus 10a of the first current-measuring signal converter 2.1 and the current-measuring apparatus 10b of the second current-measuring signal converter 2.2. The testing apparatus is designed such that it can compare the output signals of the two current-measuring apparatuses 10a, 10b, which are, as explained above, amplified voltage signals, with one another and can determine a potential deviation. If the deviation of the output signals exceeds a predetermined or predeterminable limit value that indicates a fault of the current-measuring apparatuses 10a, 10b, then the testing apparatus 30 can make a corresponding error signal available to the evaluation and control unit 4 of the safety switching apparatus 100. As an alternative, the testing apparatus 30 can also be implemented in the evaluation and control unit 4.

Furthermore, the first current-measuring signal converter 2.1 of the input circuit 2 comprises the aforementioned current-limiting apparatus 18, which is designed between the first input port 16 and the current-measuring apparatus 10a of the first current-measuring signal converter 2.1 and which is configured to limit a maximum current, which flows through the first current-measuring signal converter 2.1 and consequently, as a result of the electrical series connection, would also flow through the second current-measuring signal converter 2.2.

The current-limiting apparatus 18 has the function of an in-phase regulator and in this exemplary embodiment comprises a Zener diode 13 as well as a bipolar transistor 12. In this case, a series resistor 14 is connected between the first input port 16 of the input circuit 2 and the Zener diode 13 for purposes of limiting the current flowing through the Zener diode 13 in the event of a breakdown. The series resistor 14 may have a size of 4.7 kohms. The bipolar transistor 12 in this exemplary embodiment is an NPN transistor with a base, an emitter and a collector, which is connected as an emitter follower (and, thus, in a collector circuit), so that the collector of the bipolar transistor 12 is connected to the first input port 16 of the input circuit 2, to which a positive voltage is applied. The base of the bipolar transistor 12 is connected between the series resistor 14 and the Zener diode 13. The Zener diode 13 specifies a limit voltage for the input circuit 2, which is defined by the breakdown voltage of the Zener diode 13 and can amount to, for example, 5.6 V.

In the normal operating mode, in which the voltage is less than the breakdown voltage of the Zener diode 13, a small base-emitter current flows and controls in this way a relatively high emitter-collector current. Thus, in this kind of operation, the bipolar transistor 12 acts as a closed switch. On reaching the limit voltage (equal to the breakdown voltage), specified by the Zener diode 13, the bipolar transistor 12 is able to limit the current flow through the first current-measuring signal converter 2.1. The voltage at the shunt resistor 10.1 of the current-measuring apparatus 10a of the first current-measuring signal converter 2.1 is limited and, as a result, also the current that flows through the shunt resistors 10.1, 10.2 of the two current-measuring apparatuses 10a, 10b. In the breakdown case, the current, which is limited by the size of the series resistor 14 of the Zener diode 13, flows through the Zener diode 13 and then through the second current-measuring signal converter 2.2. Since in the breakdown case the current is limited by the shunt resistor 10.1 of the first current-measuring signal converter 2.1 and since a current, limited by the series resistor 14, flows through the Zener diode 13 into the second current-measuring signal converter 2.2, damages to the shunt resistor 10.1 of the current-measuring apparatus 10a of the first current-measuring signal converter 2.1, as well as damages to the shunt resistor 10.2 of the current-measuring apparatus 10b of the second current-measuring signal converter 2.2, which is electrically connected in series to the first current-measuring signal converter 2.1, can be prevented in an advantageous way.

In addition, the input circuit comprises a testing apparatus 15, which serves the purpose of testing that the current-limiting apparatus 18 is functioning properly. In the exemplary embodiment shown here, the testing apparatus 15 comprises an operational amplifier, in particular, an instrument amplifier, which is configured to measure and to amplify a voltage that, as a result of the current flow, drops off across the current-limiting apparatus 18 and the current-measuring apparatus 10a of the first current-measuring signal converter 2.1. This measured voltage drop then forms an analog signal, which can be received and evaluated by the evaluation and control unit 4 after a corresponding conversion into a digital signal and can be compared with a predetermined voltage limit value. If the voltage limit value is exceeded, then the evaluation and control unit 4 generates a corresponding error signal. In an alternative embodiment the testing apparatus 15 can be designed such that it can measure a voltage that drops off between the first input port 16 and the second input port 17. If the voltage limit value is exceeded, the evaluation and control unit 4 generates a corresponding error signal. As a rule, a direct evaluation of the measured voltage drop in the testing apparatus 15 is also possible in both variants described above, if the testing apparatus 15 comprises an analog comparator that can compare the measured voltage drop with a voltage limit value.

Figure 3:
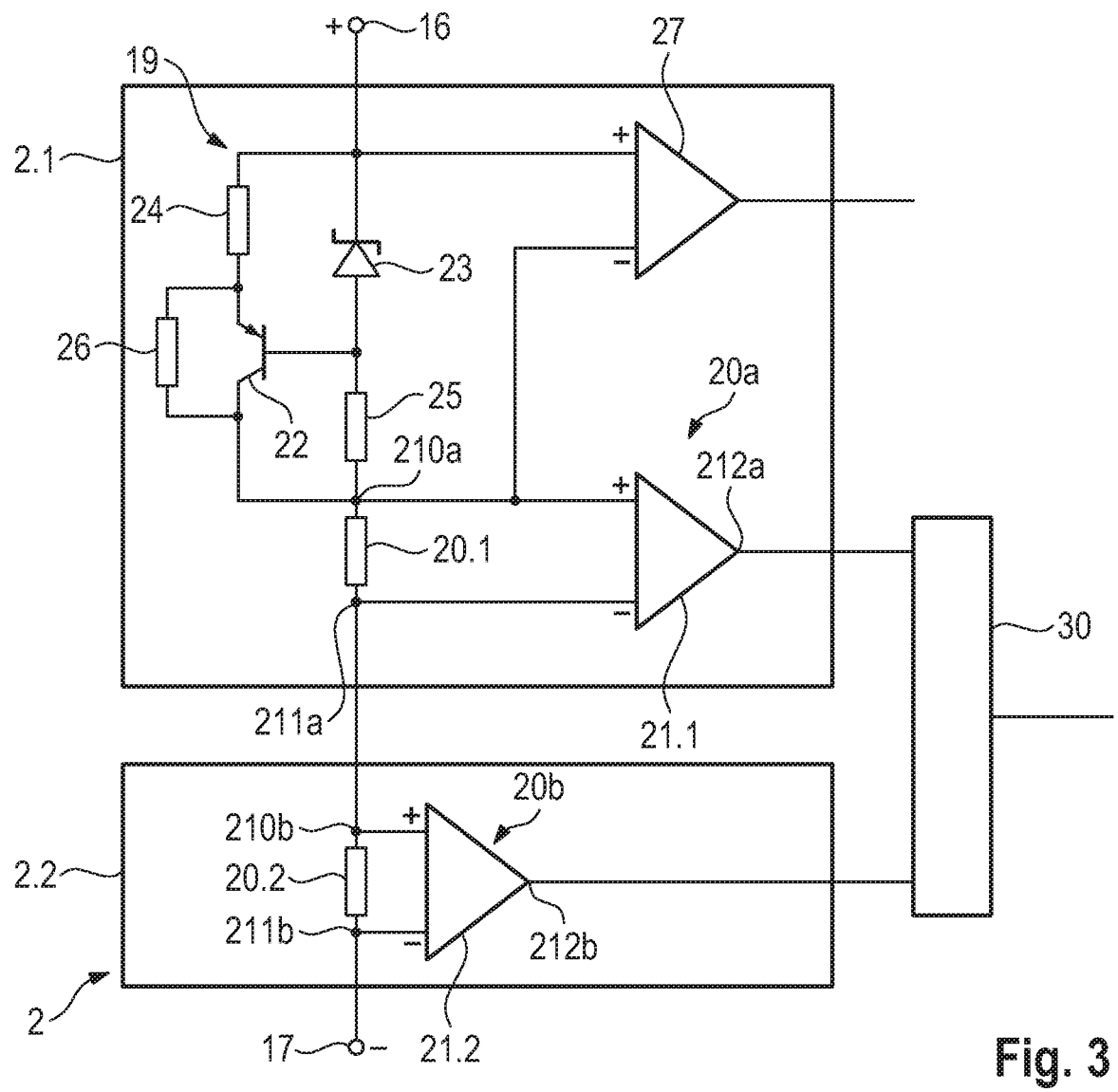
FIG. 3 is an input circuit for the safety switching apparatus in FIG. 1, the input circuit being designed in accordance with a second exemplary embodiment of the invention.

With reference to FIG. 3, a second exemplary embodiment of the input circuit 2 shall be explained in detail below. The input circuit 2 also comprises the two current-measuring signal converters 2.1, 2.2 that are electrically connected in series and in operation can receive an analog input signal, which in the present embodiment is in turn an analog current signal, from the sensor 1.1. For this purpose the input circuit comprises a differential input that is formed by a first input port 16 and a second input port 17. The sensor 1.1 can be designed, as already explained above, in particular, as a so-called 2-wire sensor, in which the energy supply, as well as the analog measuring signal, are routed over a common line. The analog measuring signal, which is an analog current signal, is made available to the input circuit 2 by way of the two input ports 16, 17 as the input signal. The sensor 1.1 may be designed, in particular, in the manner already explained above and may be configured such that it can deliver an analog current signal, the useable signal range of which is between 4 mA and 20 mA.

The first current-measuring signal converter 2.1 comprises a current-measuring apparatus 20a that in the present exemplary embodiment is also formed by a shunt resistor 20.1 as well as by an operational amplifier 21.1, in particular, by an instrument amplifier, with both the shunt resistor and the operational amplifier being connected in parallel to one another. The current-measuring apparatus 20a of the first current-measuring signal converter 2.1 comprises a first input 210a, a second input 211a and an output 212a, which is provided for emitting a first output signal, where in this case the first input 210a is connected to the first input port 16 of the input circuit 2 by way of a current-limiting apparatus 19.

The second current-measuring signal converter 2.2 also comprises a current-measuring apparatus 20b that in the present exemplary embodiment is formed by a shunt resistor 20.2, as well as by an operational amplifier 21.2, with both the shunt resistor and the operational amplifier being connected in parallel to one another. The current-measuring apparatus 20b of the second current-measuring signal converter 2.2 comprises a first input 210b, a second input 211b and an output 212b, which is provided for emitting a second output signal, where in this case the second input 211b is connected to the second input port 17 of the input circuit 2.

Since the two current-measuring signal converters 2.1, 2.2 are electrically connected in series, the second input 211a of the first current-measuring apparatus 20a is connected to the first input 210b of the second current-measuring apparatus 20b. The shunt resistors 20.1, 20.2 can have, for example, a resistance value of 50 ohms.

The two current-measuring apparatuses 20a, 20b form two current-voltage converters from a functional view. If an electric current flows through both shunt resistors 20.1, 20.2, then the current causes the voltage to drop off between the respective inputs 210a, 211a or 210b, 211b, respectively, of the current-measuring apparatuses 20a, 20b. In this case the voltage drop is, according to Ohm's law, proportional to the intensity of the current. The operational amplifiers 21.1, 21.2 serve the purpose of amplifying the measured voltage signal so that this amplified signal can be emitted as the output signal. As a result of the electrical series connection of the current-measuring signal converters 2.1, 2.2, the current, which flows during the current-measuring apparatuses 20a, 20b in the normal operating mode, is identical. Thus, when the shunt resistors 20.1, 20.2 exhibit the same size, the drop in voltage that is measured at the shunt resistor 20.1 by the current-measuring apparatus 20a of the first current-measuring signal converter 2.1 corresponds to the drop in voltage at the shunt resistor 20.2 of the current-measuring apparatus 20b of the second current-measuring signal converter 2.2.

In addition, the input circuit 2 comprises a testing apparatus 30 for testing the function of the current-measuring apparatus 20a of the first current-measuring signal converter 2.1 and the current-measuring apparatus 20b of the second current-measuring signal converter 2.2. The testing apparatus is designed such that it can compare the output signals of the two current-measuring apparatuses 20a, 20b, which are, as explained above, amplified voltage signals, with one another and can determine a potential deviation. If the deviation exceeds a predetermined or predeterminable limit value that indicates a fault of the current-measuring apparatuses 20a, 20b, then the testing apparatus 30 can make a corresponding error signal available to the evaluation and control unit 4. As an alternative, the testing apparatus 30 can also be implemented in the evaluation and control unit 4.

Furthermore, the first current-measuring signal converter 2.1 of the input circuit 2 comprises the aforementioned current-limiting apparatus 19, which is designed between the first input port 16 and the current-measuring apparatus 20a of the first current-measuring signal converter 2.1 and which is configured to limit a maximum current, which flows through the first current-measuring signal converter 2.1 and, as a result of the electrical series connection, also through the second current-measuring signal converter 2.2.

In this exemplary embodiment, the current-limiting apparatus 19 comprises a Zener diode 23, which is upstream of a series resistor 25 for purposes of limiting the current flowing through the Zener diode 23 in the event of a voltage breakdown, as well as a bipolar transistor 22, which in the present exemplary embodiment is designed as a PNP transistor, which comprises a base, an emitter and a collector and is connected as an emitter follower in a collector circuit. The series resistor 25 of the Zener diode 23 may have, for example, a size of 10 kohms. The base of the bipolar transistor 22 is connected between the Zener diode 23 and the series resistor 25. In the embodiment of the current-limiting apparatus 19 shown herein, the Zener diode 23 enables a working point adjustment of the bipolar transistor 22 and specifies a limit voltage for the input circuit 2, wherein in this case the limit voltage is given by the breakdown voltage of the Zener diode 23 and may be, for example, 2.7 V. Furthermore, upstream of the emitter of the bipolar transistor 22 there is a series resistor 24, which may be sized, for example, for 56 ohms and may specify a limit current. Between the emitter and the collector of the bipolar transistor 22 (and, thus, parallel to the emitter-collector path) there is connected a resistor 26, which may be sized, for example, for 1 kohms. This resistor 26 is able to absorb an electric power loss in the event of an overvoltage, which leads to a breakdown of the Zener diode 23.

In the normal operating mode, in which the voltage is less than the breakdown voltage of the Zener diode 23, the bipolar transistor 22 acts, as in the first exemplary embodiment, as a closed switch, so that a relatively high emitter-collector current flows. On reaching the limit voltage, specified by the Zener diode 23, the bipolar transistor 22 is able to limit the current flow through the first measuring signal converter 2.1. In the event of a voltage breakdown at the Zener diode 23, the bipolar transistor 22 acts then as an in-phase regulator so that the current is held constant. In the breakdown case, a current, which is limited by the size of the series resistor 24 and the size of the breakdown voltage of the Zener diode 23, flows through the shunt resistor 20.1 of the current-measuring apparatus 20a of the first current-measuring signal converter 2.1 and then through the shunt resistor 20.2 of the current-measuring apparatus 20b of the second current-measuring signal converter 2.2. In addition, with the increasing input current (or, more specifically, also in the case of an increasing overvoltage) a small increasing current flows through the Zener diode 23 and through the series resistor 25.

Since in the breakdown case of the Zener diode 23 only a limited current flows through the shunt resistor 20.1 of the current-measuring apparatus 20a of the first current-measuring signal converter 2.1, as well as through the shunt resistor 20.2 of the current-measuring apparatus 20b of the second current-measuring signal converter 2.2, damages to the shunt resistors 20.1, 20.2 that are induced by overvoltages can be effectively prevented in an advantageous way.

In addition, in this exemplary embodiment, the input circuit also comprises a testing apparatus 27, which serves the purpose of testing that the current-limiting apparatus 19 is functioning properly. In the exemplary embodiment shown here, the testing apparatus 27 comprises an operational amplifier, in particular, an instrument amplifier, which is configured to measure and to amplify a voltage that, as a result of the current flow, drops off across the current-limiting apparatus 19. This measured voltage drop forms then an analog signal, which can be received and evaluated by the evaluation and control unit 4 after a corresponding conversion into a digital signal and can be compared with a predetermined voltage limit value. If the voltage limit value is exceeded so that an overvoltage prevails, then the evaluation and control unit 4 generates a corresponding error signal. In an alternative embodiment, the testing apparatus 27 can also be designed such that it can measure a voltage that drops off between the first input port 16 and the second input port 17. If the voltage limit value is exceeded, the evaluation and control unit 4 generates a corresponding error signal. As a rule, a direct evaluation of the measured voltage drop in the testing apparatus 27 is also possible in both variants described above, if the testing apparatus 27 comprises an analog comparator that can compare the measured voltage drop with a voltage limit value.

What is claimed is:

1. An input circuit for the fail-safe reading in of an analog input signal of at least one sensor, the input circuit comprising:
   first and second input ports to which the sensor can be connected;
   a first current-measuring signal converter connected to the first input port and comprising a first current-measuring apparatus configured to determine a first output signal from the analog input signal when the input circuit is in operation, the first current-measuring apparatus comprising a first shunt resistor and a first amplifier to measure and amplify a first voltage drop across the first shunt resistor;
   a current-limiting apparatus inside the first current-measuring signal converter and configured to limit a maximum current that flows through the first current-measuring signal converter, wherein the current-limiting apparatus comprises an in-phase regulator including: a bipolar transistor connected as an emitter follower, a Zener diode, and a resistor in series with the Zener diode;
   at least one second current-measuring signal converter connected to the second input port and comprising a second current-measuring apparatus configured to determine a second output signal from the analog input signal when the input circuit is in operation, the second current-measuring apparatus comprising a second shunt resistor and a second amplifier to measure and amplify a second voltage drop across the second shunt resistor, wherein inputs to the first shunt resistor and the second shunt resistor are electrically connected in series between the first input port and the second input port; and
   a testing apparatus connected to the first and second current-measuring signal converters and configured to compare the first output signal with the second output signal to detect faults of the first and second current-measuring signal converters in response to deviations between the first and second output signals exceeding a predetermined or predeterminable limit value.

2. The input circuit of claim 1, wherein the first and second amplifiers each comprise an operational amplifier.

3. The input circuit of claim 1, further comprising a testing apparatus to test a function of the current-limiting apparatus.

4. The input circuit of claim 3, wherein the testing apparatus is configured to measure a voltage drop between the first input port and the second input port of the input circuit.

5. The input circuit of claim 3, wherein the testing apparatus is configured to measure a voltage drop across the current-limiting apparatus.

6. The input circuit of claim 3, wherein the testing apparatus is configured to measure a voltage drop across the current-limiting apparatus and the current-measuring apparatus of the first current-measuring signal converter.

7. A safety switching apparatus for the safe shutdown of a load device in an automatically operating technical system, the safety switching apparatus comprising:
   the input circuit according to claim 1, the input circuit being configured to provide a fail-safe reading in of an analog input signal of an analog sensor and to convert the analog input signal into at least one analog output signal;

an analog-to-digital converter to convert the at least one output analog signal of the input circuit into at least one digital signal;

a control and evaluation unit to receive and process the at least one digital signal of the at least one analog-digital converter; and at least one actuator connected to the control and evaluation unit and to the load device, the at least one actuator being controllable as a function of the digital signal.

8. An input circuit for the fail-safe reading in of an analog input signal of at least one sensor, the input circuit comprising:

first and second input ports to which the sensor can be connected;

a first current-measuring signal converter connected to the first input port and comprising a first current-measuring apparatus configured to determine a first output signal from the analog input signal when the input circuit is in operation, the first current-measuring apparatus comprising a first shunt resistor and a first amplifier to measure and amplify a first voltage drop across the first shunt resistor;

a current-limiting apparatus inside the first current-measuring signal converter and configured to limit a maximum current that flows through the first current-measuring signal converter, wherein the current-limiting apparatus comprises an in-phase regulator including: a bipolar transistor, a Zener diode, a first resistor in series with the Zener diode, and a second resistor connected between an emitter and a collector of the bipolar transistor, the second resistor being configured to absorb a power loss in response to an overvoltage being applied to the input circuit;

a second current-measuring signal converter connected to the second input port and comprising a second current-measuring apparatus configured to determine a second output signal from the analog input signal when the input circuit is in operation, the second current-measuring apparatus comprising a second shunt resistor and a second amplifier to measure and amplify a second voltage drop across the second shunt resistor, wherein inputs to the first shunt resistor and the second shunt resistor are electrically connected in series between the first input port and the second input port; and a testing apparatus connected to the first and second current-measuring signal converters and configured to compare the first output signal with the second output signal to detect faults of the first and second current-measuring signal converters in response to deviations between the first and second output signals exceeding a predetermined or predeterminable limit value.

9. The input circuit of claim 8, wherein the current-limiting apparatus further comprises a third resistor between the first input port of the input circuit and the emitter of the bipolar transistor, the third resistor setting a limit current.

10. The input circuit of claim 8, wherein the first and second amplifiers each comprise an operational amplifier.

11. The input circuit of claim 8, further comprising a testing apparatus to test a function of the current-limiting apparatus.

12. The input circuit of claim 11, wherein the testing apparatus is configured to measure a voltage drop between the first input port and the second input port of the input circuit.

13. The input circuit of claim 11, wherein the testing apparatus is configured to measure a voltage drop across the current-limiting apparatus.

14. The input circuit of claim 11, wherein the testing apparatus is configured to measure a voltage drop across the current-limiting apparatus and the current-measuring apparatus of the first current-measuring signal converter.

15. A safety switching apparatus for the safe shutdown of a load device in an automatically operating technical system, the safety switching apparatus comprising:

the input circuit according to claim 8, the input circuit being configured to provide a fail-safe reading in of an analog input signal of an analog sensor and to convert the analog input signal into at least one analog output signal;

an analog-to-digital converter to convert the at least one output analog signal of the input circuit into at least one digital signal;

a control and evaluation unit to receive and process the at least one digital signal of the at least one analog-digital converter; and at least one actuator connected to the control and evaluation unit and to the load device, the at least one actuator being controllable as a function of the digital signal.

* * * * *